United States Patent [19]

Ishitani

[11] Patent Number: 5,330,936
[45] Date of Patent: Jul. 19, 1994

[54] METHOD OF PRODUCING A SILICON NITRIDE FILM AND METHOD OF FABRICATING A SEMICONDUCTOR DEVICE

[75] Inventor: Akihiko Ishitani, Tokyo, Japan
[73] Assignee: NEC Corporation, Tokyo, Japan
[21] Appl. No.: 888,486
[22] Filed: May 27, 1992

[30] Foreign Application Priority Data

May 27, 1991 [JP] Japan .................. 3-120559

[51] Int. Cl.$^5$ .............. H01L 21/00; H01L 21/02; H01L 21/302; H01L 21/463
[52] U.S. Cl. .................. 437/241; 437/242
[58] Field of Search ................ 437/241, 242

[56] References Cited

U.S. PATENT DOCUMENTS 4,298,629  11/1981  Nozaki et al. .............. 427/527
5,080,933  1/1992  Grupen-Shemansky et al. .............. 427/255.1

FOREIGN PATENT DOCUMENTS 2-215544  8/1991  Japan .

OTHER PUBLICATIONS

Journal of Applied Physics vol. 63, Jan. 1988, No. 2, entitled, "Charge Transfer Adsorption in Silicon Vapor-Phase Epitaxial Growth," A. Ishitani, et al., cover page and pp. 390-394.

Japanese Journal of Applied Physics, vol. 29, No. 12, Dec. 1990, cover page and pp. L2322-L2324, "A Model for SiN$_x$ CVD Film Growth Mechanism by Using SiH$_4$ and NH$_3$ Source Gases," Akihiko Ishitani et al.

Primary Examiner—R. Bruce Breneman
Assistant Examiner—B. Everhart
Attorney, Agent, or Firm—Burns, Doane, Swecker & Mathis

[57] ABSTRACT

A method of producing a silicon nitride film free of photolithographty and dry etching processes and a method of fabricating a semiconductor memory cell device are disclosed. A first polycrystalline silicon film serving as a bottom electrode is selectively formed only on a silicon region of the substrate with a field oxide film and a silicon nitride film is selectively formed only on the first polycrystalline silicon film by selective chemical vapor deposition in which a source gas including a combination of both ammonia and either silane or dichlorosilane is doped with hydrogen chloride. Then, a second polycrystalline film serving as a top electrode is selectively formed on the silicon nitride film.

3 Claims, 5 Drawing Sheets

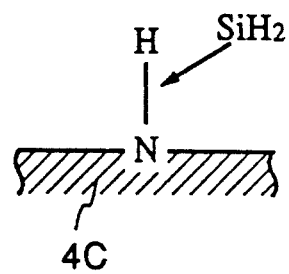
FIG. 4(a)
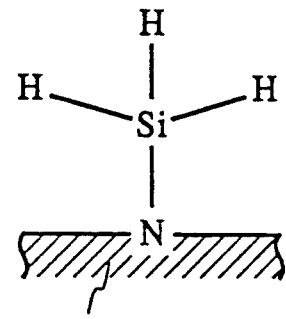
FIG. 4(b)
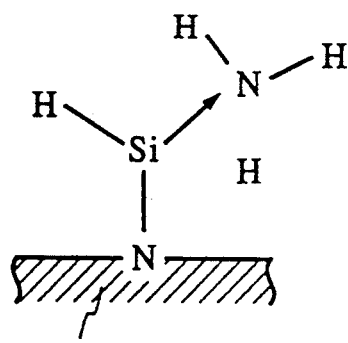
FIG. 4(c)
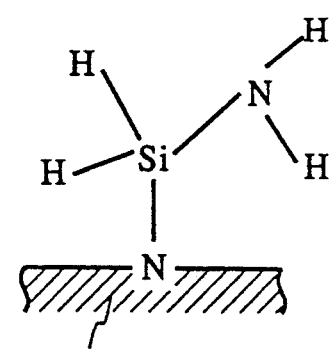
FIG. 4(d)
FIG. 5
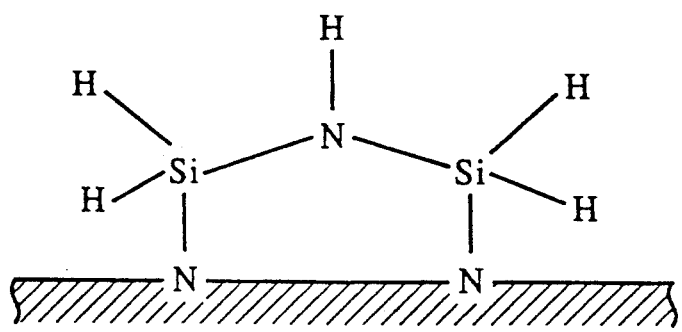
FIG. 6
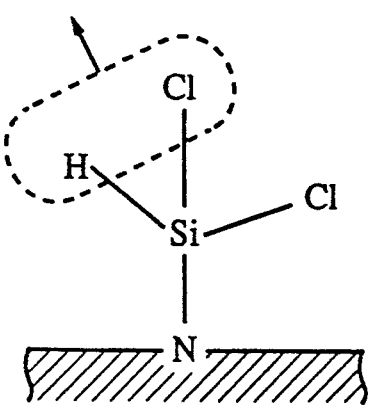

METHOD OF PRODUCING A SILICON NITRIDE FILM AND METHOD OF FABRICATING A SEMICONDUCTOR DEVICE

BACKGROUND OF THE INVENTION

The invention relates to a method of fabricating a semiconductor device, and more particularly to a method of producing a silicon nitride film serving as a insulating film of capacitors.

Stacked capacitors or trench capacitors which serve as memory cells of a dynamic random access memory (DRAM) are well known. The conventional method of fabricating the typical stacked capacitor will hereinafter be described in detail with reference to the accompanying drawings. Referring to FIG. 1, a field oxide film 1 which serves to separate a memory cell from other elements of the semiconductor device has selectively been formed on a silicon substrate 2 by the local oxidation of silicon (LOCOS), as shown in FIG. 1, before a polycrystalline silicon film 3A is deposited on the entire region of the silicon substrate 2 including the field oxide film region by chemical vapor deposition (CVD) not shown in FIG. 1. Then, the polycrystalline silicon film 3A is subjected to patterning by means of photolithography and dry etching so as to form a bottom electrode only on the silicon region of the substrate as shown in FIG. 1(b). As shown in FIG. 1(c), a silicon nitride film 4B and a polycrystalline silicon film 5A are deposited in turn on the entire region of the substrate including the field oxide film region. And then, as shown in FIG. 1(d), the polycrystalline silicon film 5A and the silicon nitride film 4B are simultaneously subjected to patterning by use of photolithography and dry etching to form a top electrode and a dielectric film respectively. Further, required in the fabrication process of the stacked capacitor are processes of controlling a conductivity of the capacitor by ion-implantation and heat treatment. Also required in the processes of photolithography and dry etching are the processes of cleaning, applying a resist, baking, exposing, removing a resist and the like.

In recent years, the selective growth techniques of the polycrystalline silicon have been developed to allow formation of the bottom electrode of the stacked capacitor which is disclosed in the specification of the Japanese patent application No. 2-215544 entitled Method of Fabricating a Semiconductor Device. In this prior art, when a polycrystalline silicon film is grown on a silicon substrate, a source gas of a silane system, for example, silane or dichlorosilane or the like, is subjected to a combination of both (1) either thermal decomposition or reduction in a hydrogen atmosphere and (2) doping with a hydrogen chloride gas at a suitable concentration. The source gas doped with the hydrogen chloride gas allows the polycrystalline silicon film to grow on the silicon substrate and also to etch silicon deposited on the silicon oxide film. Further, a low growth temperature of 750 degrees may be selected to suppress growth of a monocrystal silicon. It is possible for the prior art to provide the selective growth of the polycrystalline silicon to the silicon substrate. Consequently, photolithography and dry etching may be omitted from the processes of formation of the polycrystalline silicon film.

However, it is difficult in the set forth prior art to provide the selective growth of the silicon nitride film 4B only to the region of the polycrystalline silicon film 3A, because the source gas includes only silane system gas, for example, silane or dichlorosilane or the like. Thus, it is difficult to provide not only the selective growth of the silicon nitride film 4B serving as the dielectric film on the polycrystalline silicon film 3A serving as a bottom electrode, but also the selective growth of the polycrystalline silicon film 5A serving as a top electrode on the silicon nitride film. It may therefore be assumed that both the silicon nitride film 4B and the polycrystalline silicon film 5A is certainly subjected to patterning by photolithography and dry etching. The patterning process comprises cleaning, coating a resist, baking, exposing, dry-etching and removing a resist and the like. The prior art has many problems of particle-pollution, metal pollution and damaging of the device with deterioration of the characteristics of the device. In general, the degree of deterioration of device quality may be in proportion to the largeness of the number of processes of fabrication of the device. Further, needless time and higher cost are required for fabrication of the device.

On the other hand, the conventional fabrication method of the trench capacitor also has many of the set forth problems.

A trench may conveniently be formed within a silicon substrate serving as a bottom electrode which has been formed thereon with a silicon oxide film by means of patterning and dry etching and the like. Therefore, it is difficult for the prior art to provide the selective growth of the silicon nitride film only on the inner surface of the trench within the silicon substrate. Further, it is also difficult for the prior art to provide the selective growth of a polycrystalline silicon film serving as a top electrode only on the silicon nitride film. Consequently, as unnecessary processes, the silicon nitride film and the polycrystalline silicon film are certainly subjected to patterning by photolithography and dry etching. The prior also has many problems, for example, particle-pollution, metal-pollution and damaging of the device with deterioration of characteristics of the device. Further, unnecessary time and higher costs are required for fabrication of the device.

SUMMARY OF THE INVENTION

Objects of the present invention are to provide a method of producing a silicon nitride film and a method of fabricating a semiconductor device being enabled to completely free both photolithography and dry etching from the fabrication process of a semiconductor device.

A novel method of producing a silicon nitride film comprises the single step of subjecting a silicon substrate formed thereon with a silicon oxide film to selective chemical vapor deposition by use of a source gas comprising a combination of both ammonia and either silane or dichlorosilane which is doped with a hydrogen chloride gas so as to selectively deposit a silicon nitride film only on the silicon film region of the substrate.

In the doping concentration of the source gas, the volume ratio of either silane or dichlorosilane to hydrogen chloride may be in the range from 1:0.1 to 1:0.7 at a pressure of 1 atm.

A novel method of fabricating a semiconductor device comprises the steps of subjecting a silicon substrate formed thereon with a field oxide film to the selective growth of polycrystalline silicon so as to selectively deposit a first polycrystalline silicon film only on the silicon region of the substrate, subjecting the substrate formed thereon with the first polycrystalline silicon film to selective chemical vapor deposition of silicon nitride by use of a source gas comprising a combination of both ammonia and either silane or dichlorosilane which is doped with a hydrogen chloride gas so as to selectively deposit a silicon nitride film only on the region of the first polycrystalline silicon film, and subjecting the substrate formed thereon with the silicon nitride film to the selective growth of polycrystalline silicon so as to selectively deposit a second polycrystalline silicon film only on the silicon nitride film region.

An alternate novel method of fabricating a semiconductor device comprises the steps of subjecting a silicon substrate formed thereon with a silicon oxide film to dry etching after opening the silicon oxide film by means of patterning so as to form a trench within the silicon substrate, subjecting the substrate to selective chemical vapor deposition of silicon nitride by use of a source gas comprising a combination of both ammonia and either silane or dichlorosilane which is doped with a hydrogen chloride gas so as to selectively deposit a silicon nitride film only on the inner surface of the trench, and depositing a polycrystalline silicon film on the entire surface of the substrate formed with the silicon nitride film before the polycrystalline silicon film is subjected to the etch back so as to have the polycrystalline silicon remain only within the trench.

BRIEF DESCRIPTION OF THE DRAWINGS

Preferred embodiments of the present invention will hereinafter fully be described in detail with reference to the accompanying drawings:

FIGS. 4(a)-(d) are pictorial views illustrative of a growth mechanism of a silicon nitride film according to the present invention;

FIG. 5 is a pictorial view illustrative of a growth mechanism of a silicon nitride film according to the present invention;

FIG. 6 is a pictorial view illustrative of a growth mechanism of a silicon nitride film according to the present invention;

PREFERRED EMBODIMENTS OF THE INVENTION

Figure 1A:
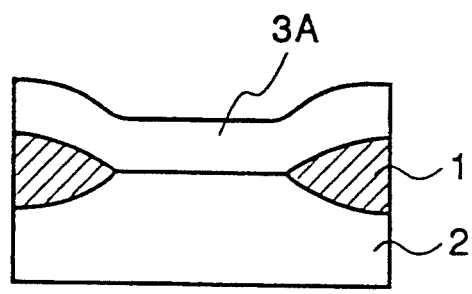
FIGS. 1(a)-(d) are fragmentary cross-sectional elevation views illustrative of one embodiment of the conventional fabrication method of the semiconductor device.
Figure 1B:
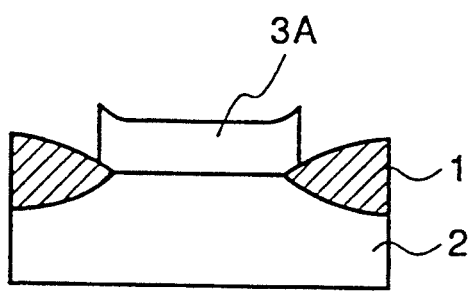
Figure 1C:
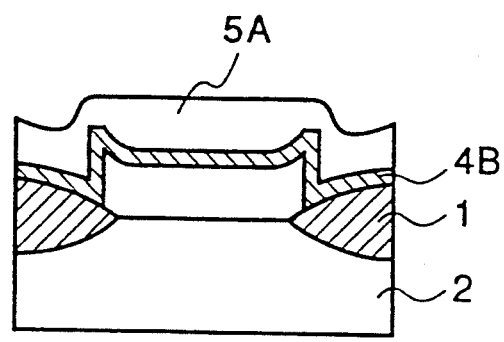
Figure 1D:
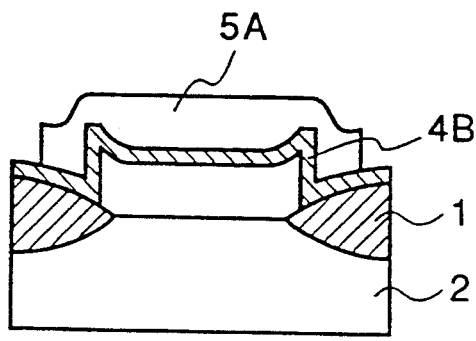

A growth mechanism of silicon nitride on a silicon nitride film will hereinafter fully be described in detail with reference to the accompanying drawings.

With regard to the growth mechanism of silicon nitride on the silicon nitride film by means of chemical vapor deposition, a combination of both silane ($SiH_4$) and ammonia ($NH_3$) may be used as a source gas of chemical vapor deposition. Silane is dissociated to silylene ($SiH_2$) and hydrogen ($H_2$) in the chemical vapor deposition reactor as shown in the following equation (1).

$$SiH_4 \rightarrow SiH_2 + H_2 \qquad (1)$$

As shown in FIG. 4(a), the dissociated silylene molecule is subjected to an insertion reaction with the nitrogen atom terminated by the hydrogen atoms on a silicon nitride film 4C to form the Si—N bond, as shown in FIG. 4(b). The above insertion reaction is disclosed in Japanese Journal of Applied Physics, Vol. 29, No. 12, December, 1990 pp. L2322-L2325 by Akihiko ISHITANI et al. At a high temperature, the chemical bonds between the sole silicon atom and the three hydrogen atoms are subjected to the elimination of the hydrogen molecule from the silicon atom which is made into new silicon atom terminated by the single hydrogen atom, as shown in FIG. 4(c). The ammonia molecule is reacted with the active silicon atom so as to form the N—Si bond, as shown in FIG. 4(d). Namely, the nitrogen atom is taken into a surface of the silicon nitride film. When the active silicon atom is present in the vicinity of the nitrogen atom, the insertion reaction between the silicon atom and the nitrogen atom is also produced to form a fresh N—Si bond, as shown in FIG. 5. This allows to form the network of a combination of both the silicon atom and the nitrogen atom in order to grow the silicon nitride film. From the description, the growth mechanism in the case of the silicon atom for the nitrogen atom may readily be understood on the set forth descriptions.

On the other hand, the growth mechanism in the case of the use of dichlorosilane for silane may be understood from the hereinafter descriptions. Dichlorosilane ($SiH_2Cl_2$) and ammonia ($NH_3$) may also be used as a source gas of chemical vapor deposition. The dichlorosilane may be subjected to dissociation of hydrogen to produce dichlolosilylene ($SiCl_2$) and hydrogen ($H_2$) as shown in the following equation (2).

$$SiH_2Cl_2 \rightarrow SiCl_2 + H_2 \qquad (2)$$

The produced dichlolosilylene molecule is subjected to an insertion reaction with the nitrogen atom terminated by the hydrogen atoms. At a high temperature, the chemical bond between the silicon atom and both the two chlorine atoms and the hydrogen atom are subjected to the elimination of the hydrogen chloride molecule (HCl) to make the silicon atom into a new silicon atom terminated by the sole chlorine atom, as shown in FIG. 6. The ammonia molecule is reacted with the active silicon atom so as to form the Si—N bond. The nitrogen atom is taken into a surface of the silicon nitride film. When the active silicon atom is present in the vicinity of the nitrogen atom, an insertion reaction between the silicon atom and the nitrogen atom is also produced to form a fresh Si—N bond. This allows to form the network of a combination of both the silicon atom and the nitrogen atom in order to grow the silicon nitride film. In this case, a growth temperature is higher than a growth temperature of the set forth source gas of silane with the low decomposition temperature thereof.

On the other hand, a growth mechanism of silicon nitride on the silicon film will hereinafter fully be described in detail with reference to the accompanying drawings. In the case of the present invention, both the polycrystalline silicon film and the silicon oxide film are present on a surface of the silicon substrate before growing the silicon nitride film. Because both the nitrogen atom and the silicon atom which are terminated by the hydrogen atoms are not present in the surface of the silicon substrate, no insertion reaction is carried out. Particularly, in the initial growth, a growth mechanism of silicon nitride on the silicon oxide film is completely different from a growth mechanism of that on the silicon film.

Figure 7:
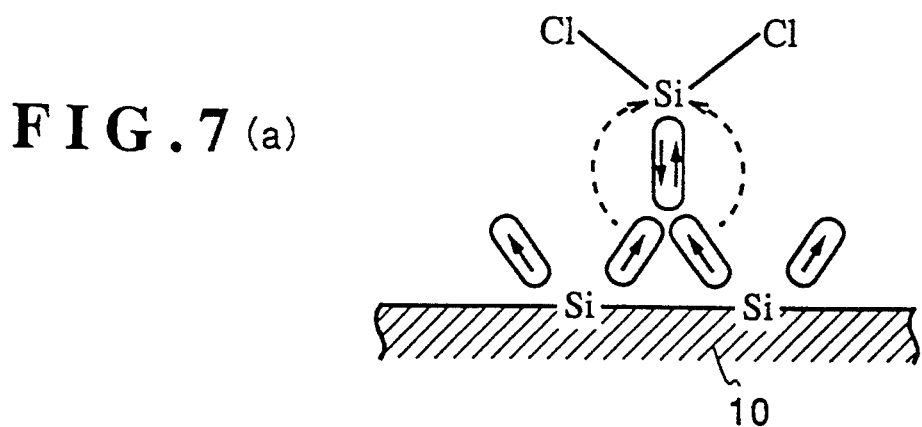
FIGS. 7(a)-(d) are pictorial views illustrative of a growth mechanism of a silicon nitride film on a silicon film according to the present invention.
Figure 7:
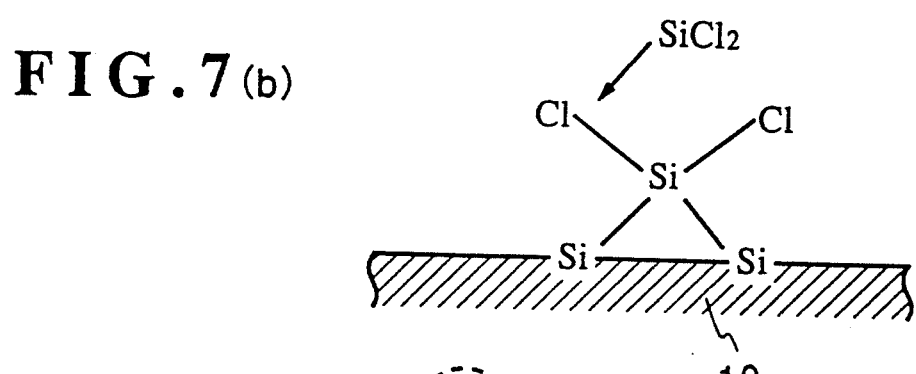
Figure 7:
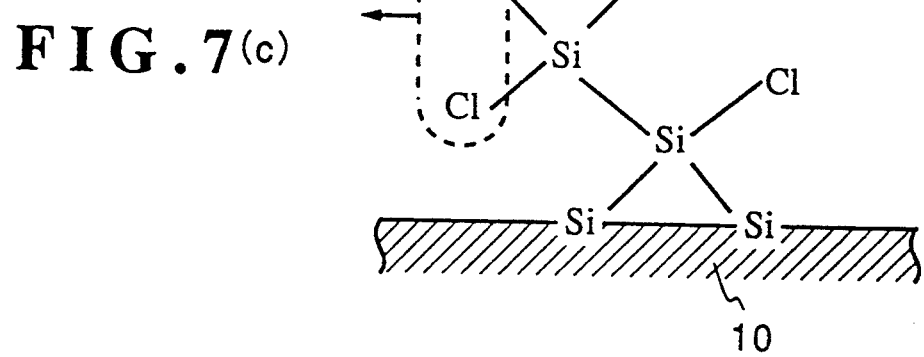

First, the growth mechanism of the silicon nitride film on the silicon film will hereinafter fully be described in detail with reference to the accompanying drawings. A charge transfer adsorption of either silylene or dichlolosilylene is carried out on either a polycrystalline silicon film or a monocrystal silicon film. The charge transfer adsorption is described in Journal of Applied Physics, Vol. 63, No. 2, January 1988, by A. ISHITANI et al. As shown in FIG. 7(a), the charge transfer adsorption is caused by dangling bonds in the silicon atom on the surface of the silicon film 10. As shown in FIG. 7(b), either an insertion reaction of silylene into a Si—H bond thereof or an insertion reaction of dichlolosilylene into a Si—Cl bond thereof is carried out. As shown in FIG. 7(c), either the hydrogen molecule or the chlorine molecule is eliminated from the silicon atom to be made into a similar state of the silicon atom to the state thereof shown in FIG. 4(c). Consequently, both the chemical adsorption of ammonia and the insertion reaction of silylene are carried out to grow the silicon nitride film.

Figure 8:
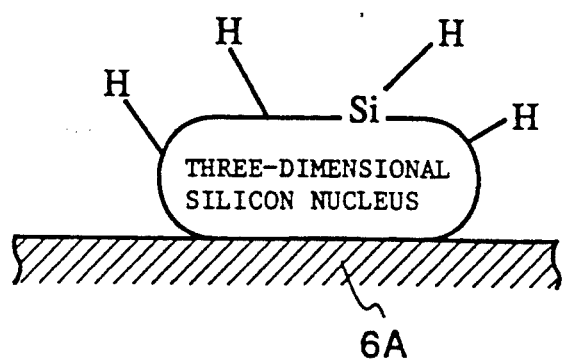
FIG. 8 is a pictorial view illustrative of a growth mechanism of a silicon nitride film on a silicon oxide film according to the present invention.

Second, a growth mechanism of silicon nitride on the silicon oxide film will hereinafter fully be described in detail with reference to the accompanying drawings. A silicon oxide film comprises the network bonding comprising Si—O bonds which comprise mainly six-membered rings and eight-membered rings, but also a few four-membered rings and ten-membered rings and other membered rings. A surface of the silicon oxide film also comprises such membered rings. Then, on the surface of the silicon oxide film, no dangling bond in the silicon atom is present which is completely different from the state of the silicon film surface. The silicon atom in the silicon oxide film is normally terminated by the oxygen atom. Consequently, on the surface of the silicon oxide film 6A, an adsorption of silicon and silylene is carried out to increase a density thereof, so that a three-dimensional nucleus is produced, as shown in FIG. 8. On the three-dimensional nucleus surface, an insertion reaction of either a Si—H bond with silylene or a Si—Cl bond with dichlolosilylene is carried out to produce a new silicon atom being in the similar state to the state thereof shown in FIG. 4(b). An elimination reaction of either hydrogen or chlorine converts the silicon atom to a new silicon atom being in the state equivalent to the state thereof shown in FIG. 4(c). As shown in FIG. 4(d), both the chemical adsorption of ammonia and the insertion reaction of silylene are carried out to grow the silicon nitride film.

It may therefore be understood that the initial growth mechanism of the silicon nitride film on the silicon film surface is completely different from the initial growth mechanism on a silicon oxide film which allows selective growth of the silicon nitride film. As is well known, hydrogen chloride promotes providing a dissociation of a Si—Si bond at a high temperature so as to serve as the etching gas for silicon. The source gas system for growing the silicon nitride film is doped with hydrogen chloride to suppress producing the three-dimensional nucleus of silicon by means of etching. The above mentioned mechanism allows suppressing the silicon nitride film growth on the silicon oxide film. It may therefore be understood that the silicon nitride film is deposited only on the silicon film opposite to the silicon oxide film but on condition that the etching rate of the silicon nucleus with hydrogen chloride is higher than the deposition rate thereof and on condition that the etching rate of the silicon nitride with hydrogen chloride is relatively lower than the deposition rate thereof. Namely, the selective deposition of silicon nitride depends upon the etching effect and an amount of the supply of either silane or dichlorosilane by means of both the charge transfer adsorption and the insertion reaction.

Figure 2A:
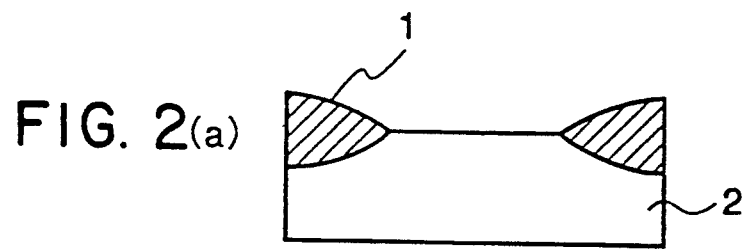
FIGS. 2(a)-(d) are fragmentary cross-sectional elevation views illustrative of an embodiment of a novel fabrication method of the semiconductor device according to the present invention.
Figure 2B:
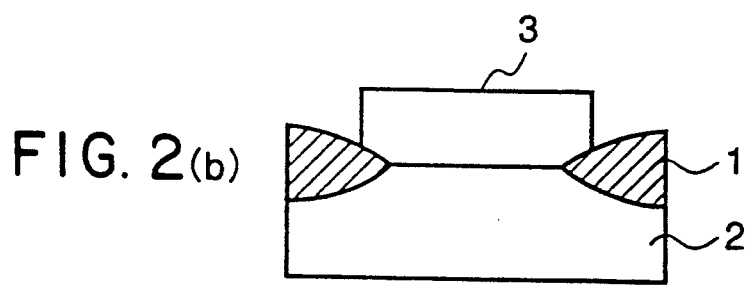
Figure 2C:
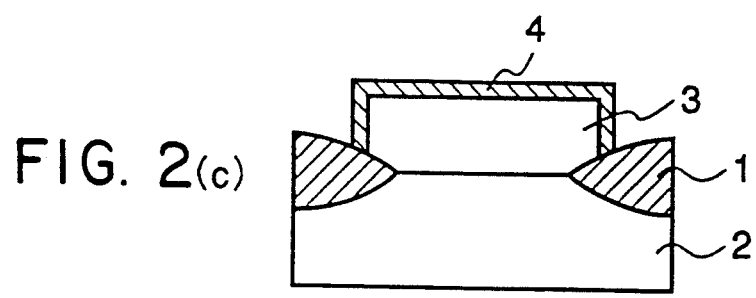
Figure 2D:
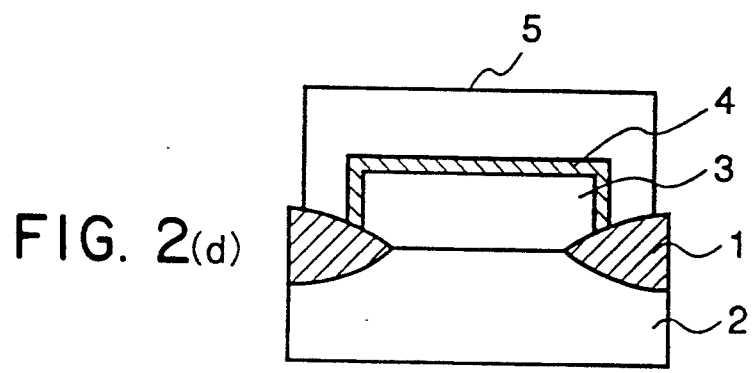

An embodiment of a novel method of fabricating a typical stacked capacitor serving as memory cells will hereinafter fully be described in detail with reference to the accompanying drawings. Referring to FIG. 2(a), a field oxide film is formed up to thickness of 200 nm on a silicon substrate 2 by means of the local oxidation of silicon (LOCOS) so as to provide electrical separation of the capacitor from another element. As shown in FIG. 2(b), a polycrystalline silicon film 3 is deposited up to 40 nm only on the silicon region of the substrate opposite to the field oxide film region by means of the selective growth of polycrystalline silicon so as to form a bottom electrode of the capacitor. As shown in FIG. 2(c), a silicon nitride film 4 is selectively deposited up to 10 nm only on the polycrystalline silicon film 3 by means of the set forth selective chemical vapor deposition of silicon nitride so as to form a dielectric film of the capacitor. As shown in FIG. 2(d), a polycrystalline silicon film 5 is deposited up to 200 nm on the silicon nitride film 4 by means of the selective growth of polycrystalline silicon so as to form a top electrode of the capacitor. The stacked capacitor is completely fabricated without photolithography and dry etching. In the process of depositing the silicon nitride film 4, the selective chemical vapor deposition is carried out on condition that silicon diluted with helium/ammonia/hydrogen chloride is 60/1200/5 (sccm), the growth pressure is 0.18 torr and a growth temperature is 800 degrees. In this case, the silane gas is diluted with helium up to 1:4 in the volume ratio of silane to helium and the volume of a pure silane gas is 12 sccm. The selective chemical vapor deposition of silicon nitride is available on condition that the volume ratio of pure silane to hydrogen chloride is in the range of the volume ratio from 1:0.25 to 1:0.6 at a growth temperature of 800 degrees and at pressure of 1 atm. When the volume ratio of pure silane to hydrogen chloride is greater than 1:0.6, the polycrystalline silicon film 3 may be etched. In contrast, when the volume ratio of pure silane to hydrogen chloride is less than 1:0.25, the selective chemical vapor deposition is not available. Growth of silicon crystal may be carried out on the field silicon oxide film on condition that the volume ratio of silane to hydrogen chloride is in the range from 1:0.25 to 1:0.3. Preferably, the volume ratio of silane to hydrogen chloride is in the range from 1:0.3 to 1:0.6. But at a high temperature, for example 850 degrees, decomposition of silane is promoted to increase the partial pressure of silylene, so that the selective chemical vapor deposition of silicon nitride may be available on condition that the volume ratio of silane to hydrogen chloride is less than 1:0.7.

Also, dichlorosilane serving as a source gas includes chlorine atoms. Hydrogen chlorine is produced during growth of the silicon nitride film. A volume of hydrogen chloride to be doped into dichlorosilane may be less than a volume of hydrogen chloride to be doped into silane in order to allow the selective chemical vapor deposition of silicon nitride. At a growth temperature of 850 degrees and growth pressure of 0.18 Torr, the selective chemical vapor deposition of silicon nitride is available on condition that the volume ratio of dichlorosilane to hydrogen chloride is in the range of the volume ratio from 1:0.1 to 1:0.4. On condition that at a growth temperature of 850 degrees and growth pressure of 0.18 Torr, the volume ratio of dichlorosilane to hydrogen chloride is greater than 1:0.4, the selective chemical vapor deposition is not available, because the growth rate of silicon nitride is less than 0.1 nm/min. In contrast, when the volume ratio of dichlorosilane to hydrogen chloride is greater than 1:0.15, the selective chemical vapor deposition is available. Namely, silicon nitride is not deposited on the field silicon oxide film.

Figure 3A:
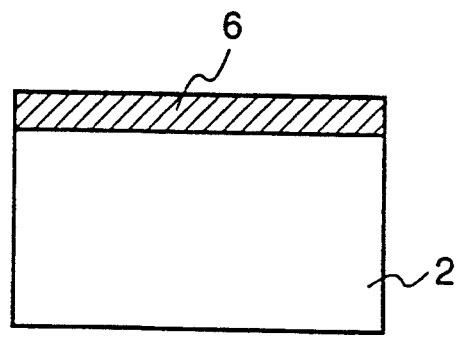
FIGS. 3(a)-(d) are fragmentary cross-sectional elevation views illustrative of alternate embodiment of a novel fabrication method of the semiconductor device according to the present invention.
Figure 3B:
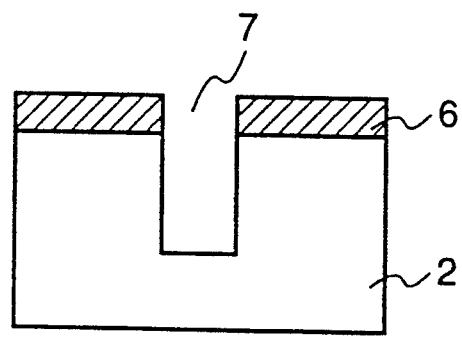
Figure 3C:
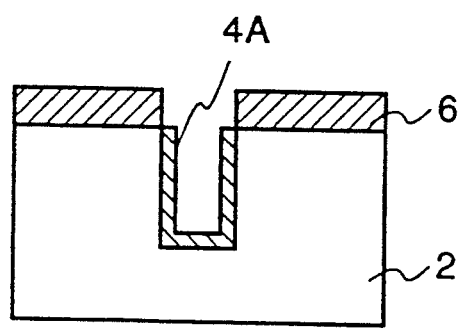
Figure 3D:
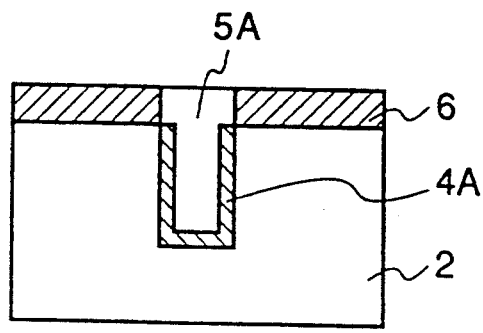

A second embodiment of an alternate novel method of fabricating the trench capacitor serving as the memory cells will hereinafter fully be described in detail with reference to the accompanying drawings. Referring to FIG. 3(a), a silicon oxide film 6 for electrically separating the capacitor from other elements is formed up to approximately 300 nm on the entire surface of the silicon substrate 2 by means of the thermal oxidation or the like. As shown in FIG. 3(b), the silicon oxide film 6 is subjected to patterning to form an opening therein. The silicon substrate 2 serving as a bottom electrode of the capacitor is subjected to dry etching by use of the silicon oxide film 6 as a mask so as to form a trench 7 therein. As shown in FIG. 3(c), a silicon nitride film 4A serving as a dielectric film is selectively deposited only on an inner surface of the trench by means of the set forth selective chemical vapor deposition of silicon nitride. As shown in FIG. 3(d), a polycrystalline silicon film 5A is deposited on the entire surface of the substrate. The polycrystalline silicon film 5A serving as a top electrode is subjected to an etch back so as to have the polycrystalline silicon film remain only within the trench. The trench capacitor is completely fabricated without photolithography and dry etching for forming the silicon nitride film.

As in the set forth description, the selective growth technique according to the present invention permits completely freeing the processes of both photolithography and dry etching from processes of fabricating the capacitors. This allows to substantially decrease the cost of fabrication thereof and further to omit processes of cleaning, applying a resist, baking, exposing, dry etching and removing a resist and the like. The required semiconductor device without deterioration of both quality and a characteristic thereof may readily and certainly be obtained but with a lower cost.

Whereas modifications of the present invention will no doubt be apparent to a person of ordinary skilled in the art , it is to be understood that the embodiments shown and described by way of illustration are by no means intended to be considered in a limiting since. Accordingly, it is to be intended by the claims to cover all modifications of the invention which fall within the spirit and scope of the invention.

What is claimed is:

1. A method of producing a silicon nitride film consisting essentially of the step of:
    subjecting a substrate, having both a silicon film region and a silicon oxide film region, to selective chemical vapor deposition of silicon nitride so as to deposit a silicon nitride film only on the silicon film region of the substrate,
    wherein said selective chemical vapor deposition is carried out by use of a source gas comprising ammonia and a silane system, said source gas being subject to doping with hydrogen chloride and,
    wherein a volume ratio of said silane system to hydrogen chloride is in the range of a volume ratio from 1:0.1 to 1:0.7 at a pressure of 1 atm.

2. A method of producing a silicon nitride film as claimed in claim 1, wherein the silane system comprises silane.

3. A method of producing a silicon nitride film as claimed in claim 1, wherein the silane system comprises dichlorosilane.

* * * * *